(12) United States Patent
Oguchi

(10) Patent No.: US 7,067,344 B1
(45) Date of Patent: Jun. 27, 2006

(54) METHOD OF MANUFACTURING AN EXTERNAL FORCE DETECTION SENSOR

(75) Inventor: Takahiro Oguchi, Sagamihara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/548,414

(22) Filed: Apr. 13, 2000

(30) Foreign Application Priority Data

Apr. 19, 1999 (JP) ............................................. 11-111298
Feb. 3, 2000 (JP) ....................................... 2000-026139

(51) Int. Cl.
    *H10L 21/302* (2006.01)

(52) U.S. Cl. .......................... 438/53; 438/456; 438/459; 438/700; 438/740

(58) Field of Classification Search ................... 438/53, 438/456, 700, 740, 970, 459, 977, FOR. 432, 438/FOR. 438, FOR. 105, FOR. 131, FOR. 485, 438/52; 148/DIG. 135, DIG. 159, DIG. 12
See application file for complete search history.

(56) References Cited

U.S. PATENT DOCUMENTS

| | | | |
|---|---|---|---|
| 5,343,064 A | | 8/1994 | Spangler |
| 5,385,867 A | * | 1/1995 | Ueda et al. |
| 5,405,797 A | * | 4/1995 | Brugger |
| 5,610,431 A | | 3/1997 | Martin |
| 5,654,244 A | * | 8/1997 | Sakai et al. |
| 6,004,874 A | * | 12/1999 | Cleeves |
| 6,043,001 A | * | 3/2000 | Hirsh et al. |
| 6,140,142 A | * | 10/2000 | Ikeda et al. |
| 6,172,721 B1 | * | 1/2001 | Murade et al. |
| 6,177,351 B1 | * | 1/2001 | Beratan et al. |
| 6,207,976 B1 | * | 3/2001 | Takahashi et al. |
| 6,261,953 B1 | * | 7/2001 | Uozumi |
| 6,313,030 B1 | * | 11/2001 | Kikuta |

FOREIGN PATENT DOCUMENTS

| | | |
|---|---|---|
| DE | 44 42 023 | 5/1996 |
| DE | 196 10 782 | 9/1997 |
| DE | 197 15 194 | 10/1997 |
| EP | 0 817 256 | 1/1998 |
| JP | 9-330892 | 12/1997 |
| JP | 10-001400 | 1/1998 |
| JP | 10-242483 | 9/1998 |
| WO | WO 98/32595 | 7/1998 |

OTHER PUBLICATIONS

Fujiwara, et al. "Charge accumulation effects on profile distortion in ECR plasma etching", Plasma Sources Sci. Technol. 5 (1996), pp. 126–131.

(Continued)

*Primary Examiner*—George Fourson
*Assistant Examiner*—Joannie Adelle Garcia
(74) *Attorney, Agent, or Firm*—Keating & Bennett, LLP

(57) ABSTRACT

A method of manufacturing an external force detection sensor in which a sensor element is formed by through-hole dry etching of an element substrate, and an electrically conductive material is used as an etching stop layer during the dry etching.

13 Claims, 8 Drawing Sheets

OTHER PUBLICATIONS

Zhixiong et al., "Laterally Capacity Sensed Accelerometer Fabricated With The Anodic Bonding And The High Aspect Ratio Etching", Solid–State and Integrated Circuit Technology 1998 Proceedings, $5^{th}$ International Conference in Beijing, China, Oct. 21–23, 1998, pp. 921–924, IEEE, Piscataway, NJ.

Mochida et al, "A Micromachined Vibrating Rate Gyroscope With Independent Beams For The Drive And Dectetion Modes", Micro Electro Mechanical Systems 1999, MEMS '99, $12^{th}$ IEEE International Conference in Orlando, FL, Jan. 17–21, 1999, pp. 618–623, IEEE, Piscataway, NJ,.

Klassen et al., "Silicon Fusion Bonding And Deep Reactive Ion Etching: A New Technology For Microstructures", Proc. Of Transducers '95, $8^{th}$ International Conference on Solid–State Sensors and Actuators, Stockholm, Sweden, Jun. 25–29, 1995, pp. 556–559, vol. 1.

Franssila et al., "Etching Through Silicon Wafter In Inductively Coupled Plasma", Microsystem Technologies, , Apr. 2000, pp. 141–144, vol. 6, No. 4, Berlin, DE.

Official Communication issued in the corresponding European Application No. 00 108 261.9–2203 dated Jul. 15, 2005.

* cited by examiner

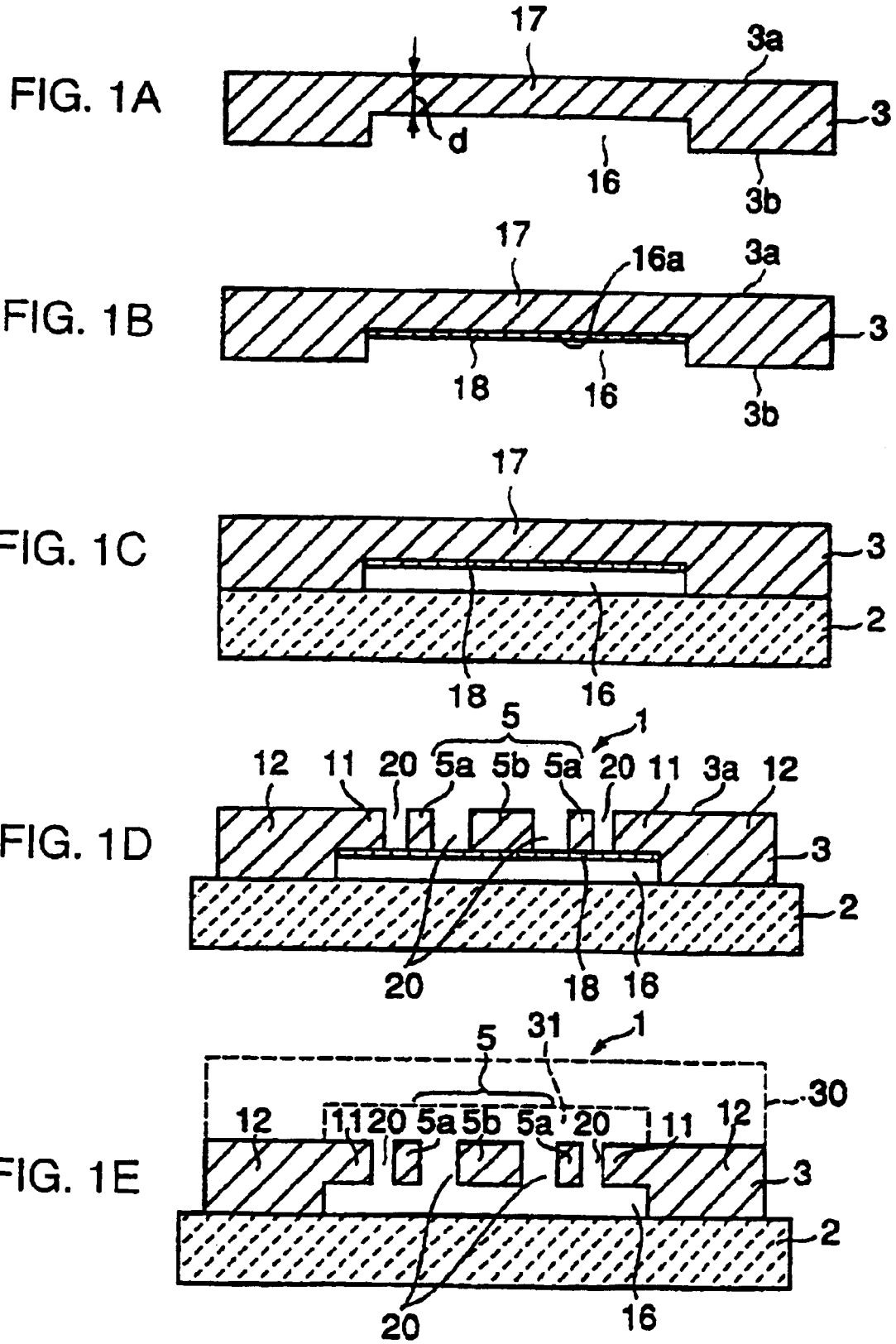

METHOD OF MANUFACTURING AN EXTERNAL FORCE DETECTION SENSOR

BACKGROUND OF THE INVENTION

1. Field of the Invention

The present invention relates to a method of manufacturing an external force detection sensor, such as an angular velocity sensor and an acceleration sensor.

2. Description of the Related Art

FIG. 6A illustrates a top plan view of an angular velocity sensor which is an external force detection sensor, and FIG. 6B illustrates a section taken along the line A—A indicated in FIG. 6A. A sensor element 1 to constitute the angular velocity sensor illustrated in FIG. 6A and FIG. 6B is of predetermined shape in which an element substrate 3 (e.g., a semi-conductor substrate such as a single crystal silicon substrate) to be joined with, for example, a glass support substrate 2 is dry-etched.

As illustrated in FIG. 6A and FIG. 6B, an oscillating body 5 is arranged in a floating condition from the above-described support substrate 2 above a surface 2a which is a surface in the direction of the X-Y plane of the above-described support substrate 2. In the oscillating body 5, a weight 5b is provided inside a frame body 5a. A plurality of (four in an example in FIGS. 6A and 6B) fixed parts 6 are arranged on the support substrate 2 in a fixed manner with intervals from each other, and the oscillating body 5 is supported in an oscillating manner in the X-direction and the Y-direction by each fixed part 6 through each L-shaped support beam (beam) 7.

Comb-toothed movable electrodes 10 (10a, 10b) are formed on right and left sides of the oscillating body 5 as viewed in FIG. 6A outwardly in each direction of the X-axis, and fixed comb-toothed electrodes 11 (11a, 11b) to be engaged with the movable electrodes 10 through clearance are extended inward of fixed parts 12 in each direction of the X-axis.

An electrically conductive pattern not illustrated is connected to the comb-toothed electrodes 11a, 11b, and the voltage is applied to the fixed comb-toothed electrodes 11a, 11b from each external side through the electrically conductive pattern. For example, when AC voltages different in phase by 180° are applied to the fixed comb-toothed electrodes 11a, 11b through the electrically conductive pattern with the movable electrodes 10a, 10b in the condition of a specified fixed voltage (e.g., zero V), electrostatic forces opposite in direction to each other are generated between the movable electrode 10a and the fixed comb-toothed electrode 11a, and between the movable electrode 10b and the fixed comb-toothed electrode 11b, and the oscillating body 5 is excitation-oscillated in the X-direction by the electrostatic forces.

Movable electrodes 13 (13a, 13b) are extended on upper and lower sides of the oscillating body 5 as viewed in FIG. 6A in each longitudinal direction, i.e., each direction of the Y-axis, and fixed electrodes 14 (14a, 14b) opposite to the movable electrodes 13 through a clearance are extended inward of a fixed part 15 in the longitudinal direction.

In the angular velocity sensor (external force detection sensor) of the above-described constitution, a Coriolis force is generated in the Y-direction when the external force detection sensor is rotated about a Z-axis orthogonal to the direction of the X-Y plane in a condition where the oscillating body 5 is excitation-oscillated in the X-direction as described above. The Coriolis force is applied to the oscillating body 5, and the oscillating body 5 is oscillated in the direction of the Coriolis force. The clearance between the above-described movable electrodes 13 and fixed electrodes 14 is changed by the oscillation in the Y-direction of the oscillating body 5 attributable to the Coriolis force, and the electrostatic capacity between the movable electrodes 13 and the fixed electrodes 14 is changed. The magnitude of the angular velocity of the rotation can be detected by detecting the electrical signal corresponding to the magnitude of the amplitude of the oscillation in the Y-direction of the oscillating body 5 generated by the above-described Coriolis force making use of the change in electrostatic capacity. Thus, the sensor element 1 of the angular velocity sensor illustrated in FIGS. 6A and 6B forms a movable element having a movable part such as the oscillating body 5 and a support beam 7.

An example of a conventional method of manufacturing the angular velocity sensor illustrated in FIGS. 6A and 6B is briefly described referring to FIG. 7A to FIG. 7E. For example, as illustrated in FIG. 7A, a recess 16 is formed on a back surface 3b of the element substrate 3 by a dry etching technology such as RIE (Reactive Ion Etching) to form, for example, a membrane (diaphragm) 17 of 60–70 μm in thickness d.

As illustrated in FIG. 7B, an etching stop layer 18 comprised of silicon oxide is formed on a top surface 16a of the above-described recessed part 16 using a film forming technology such as CVD (Chemical Vapor Deposition).

As illustrated in FIG. 7C, the support substrate 2 is arranged on the back surface 3b side of the above-described element substrate 3, the support substrate 2 and the element substrate 3 are heated to high temperature, and a high voltage is applied thereto to anode-join the support substrate 2 with the element substrate 3.

After that, the membrane 17 of the above-described support substrate 2 is machined making use of a photolithography method and RIE to form a plurality of through holes 20 reaching from the surface 3a of the element substrate 3 to the above-described etching stop layer 18 as illustrated in FIG. 7D, and the sensor element 1 is formed by forming the oscillating body 5, the support beam 7, the movable electrode 10, the fixed comb-toothed electrode 11, the movable electrode 13, the fixed electrode 14, etc. by a plurality of these through holes 20. In this specification and the claims, the dry etching technology to form the through holes to be passed from the face side to the back surface side of the substrate is referred to as "through-hole dry etching".

As described above, after the sensor element 1 is formed, the etching stop layer 18 is removed by a wet etching process using a buffer hydrofluoric acid aqueous solution as illustrated in FIG. 7E. The angular velocity sensor as illustrated in FIGS. 6A and 6B can thus be manufactured.

The etching stop layer 18 to be formed in manufacturing the external force detection sensor such as the angular velocity sensor has to be conventionally formed of an insulating material such as silicon oxide from the viewpoint of facilitation of forming a layer and simplification of a manufacturing process of the external force detection sensor. However, the inventor noticed that a notch (a profile distortion) is formed on a lower part side (i.e., a side on which the etching stop layer 18 is formed) of a side wall surface of the through holes 20 as illustrated in FIG. 7E since the etching stop layer 18 is formed of the insulating material as described above.

This may be considered attributable to the following reason. For example, when the element substrate 3 is machined by through-hole dry etching to form the sensor element 1, the etching removal is achieved faster in a hole larger in etching removal area such as a through hole 20a between the frame body 5a and the weight 5b of the oscillating body 5 illustrated in FIG. 6A than in a hole smaller in etching removal area such as a through hole (an etching groove) 20a between the movable electrode 10 and the fixed comb-toothed electrode 11 by the micro-loading effect.

The time required to achieve the etching removal up to the etching stop layer 18 and complete the forming of the through holes 20 after the through-hole dry etching is started is different for each through hole 20 by the difference in the above-described etching removal area. Since the above-described through-hole dry etching is continuously performed until the forming of all through holes 20 is completed, some through holes 20 which are continuously exposed to an etching gas though the etching removal is completed are generated (hereinafter, these through holes are referred to as the "over etched through holes").

The etching gas continuously enters such over etched through holes 20 during the over-etching, and the etching stop layer 18 at a bottom part of these over etched through holes 20 is charged positive by the collision of the positive ion in the etching gas.

When the etching is continued even after the etching stop layer 18 is charged positive and the etching gas continuously enters inside the over etched through holes 20, the positive ion in the etching gas is advanced straight toward the etching stop layer 18 inside the through holes 20, but repulsed by the positive charge of the above-described etching stop layer 18 immediately before the positive ion reaches the etching stop layer 18. In addition, the side wall surface of the over etched through holes 20 is charged negative by the collision of the electron in the etching gas, and thus, the above-described positive ion is attracted to the side wall surface of the through holes 20 immediately before it reaches the etching stop layer 18, and the course of the positive ion is largely curved. As a result, the positive ion in the etching gas collides with the bottom we side (the side on which the etching stop layer 18 is formed) of the side wall surface of the through hole 20 to form the notch n as illustrated in FIG. 7E.

Since the etching stop layer 18 is formed of the insulating material, it is found that the following problem can occur. When no through holes 20 are completed yet while the through hole dry etching is performed to form the through holes 20, as shown in FIG. 8A, the heat generated in the side wall surface of the through holes 20 (as shown by the arrows in FIG. 8A) is diffused into the membrane 17, and the area to be dry-etched of the membrane 17 or the like is heated to the same temperature almost over the whole area.

However, when through holes 20A are generated during the over etching as illustrated in FIG. 8B, the temperature of a part between the over etched through holes 20A (for example, a hole indicated by the reference numeral 21 in FIG. 8B) rises. That is, when the electrons in the etching gas collide with the side wall surface of the through hole 20A during the over etching to generate heat, the hole 21 is thermally independent from other areas since the etching stop layer 18 is formed of the insulating material and its heat conductivity is very inferior, the heat is stored in the side wall surface of the hole 21, and the temperature of the hole 21 rises higher than the other areas. Thus, the hole 21 becomes easier to etch than the other areas, the etching removal is excessively achieved as indicated by a solid line while the true etching removal should be originally achieved to the dimension as indicated by a broken line in FIG. 8C, resulting in a part not being formed to the designed dimension because of the excessive etching.

As described above, the inventor noticed that the notch n is formed on the etching stop layer 18 side of the side wall surface of the through holes 20, excessive etching is generated, and the sensor element 1 can not be formed to the designed dimension with excellent accuracy since the etching stop layer 18 has been formed of the insulating material in a conventional practice. For example, since the sensor element 1 can not thus be formed with excellent dimensional accuracy, stable output sensitivity of the external force detection sensor can not be obtained.

SUMMARY OF THE INVENTION

Accordingly, the present invention can solve the problem associated with the conventional art and provides a manufacturing method of an external force detection sensor capable of forming a sensor element to the designed dimension with excellent accuracy.

To achieve the above-described purpose, the present invention, in accordance with a first aspect, uses an electrically conductive material as an etching stop layer during dry-etching of the above-described element substrate The method of manufacturing the external force detection sensor according to a second aspect of the present invention is characterized in including a process in which a recessed part is formed on a back surface side of the element substrate and a membrane is formed on a face side, a process in which an etching-stop layer comprised of the electrically conductive material is provided on a top surface of the recessed part of the above-described element substrate, a process in which the back surface side of the element substrate is joined with a support substrate, and a process in which a sensor element is formed by dry-etching the membrane of the above-described element substrate.

According to a third aspect of the invention, the manufacturing method of manufacturing the external force detection sensor is characterized in that the recessed part to constitute the above-described second invention is formed in a center part of the back surface of the element substrate.

According to a fourth aspect of the invention, the method of manufacturing the external force detection sensor is characterized in that the etching stop layer comprised of the electrically conductive material is interposed between the above-described element substrate and a dummy support substrate to support this element substrate in the manufacturing method of the external force detection sensor to form the sensor element by effecting the through-hole dry etching of the element substrate.

According to a fifth aspect of the invention, the method of manufacturing the external force detection sensor is characterized in that the constitution of the above-described fourth aspect is provided, and after the sensor element is formed on the element substrate, the dummy support substrate and the etching stop layer are removed, and then, the support substrate with the recessed part formed therein is arranged on a back surface side of the element substrate to arrange the recessed part of the above-described support substrate opposite to the sensor element of the above-described element substrate, and the support substrate is joined with the element substrate.

According to a sixth aspect of the invention, the method of manufacturing the external force detection sensor is characterized in that the etching stop layer comprised of the electrically conductive material is formed in a set sensor element forming area on the back surface side of the element substrate, the support substrate with the recessed part formed therein is arranged on the backsurface side of the element substrate to arrange the recessed part of the support substrate opposite to the etching stop layer of the element substrate, the support substrate is joined with the element substrate, and then, the sensor element forming area of the above-described element substrate is machined by the through-hole dry-etching from the face side to form the sensor element.

According to a seventh aspect of the invention, the method of manufacturing the external force detection sensor is characterized in that the etching stop layer comprised of the electrically conductive material is formed in the set sensor element forming area on the back surface side of the element substrate, the support substrate with the recessed part formed therein is arranged on the back surface side of the above-described element substrate to arrange the recessed part in the above-described support substrate opposite to the etching stop layer of the above-described element substrate, and then, the support substrate is joined with the element substrate, and then, the thickness of the above-described element substrate is reduced to a specified value, and then, the sensor element forming area of the above-described element substrate is machined by through-hole dry-etching from the face side to form the sensor element.

According to an eighth aspect of the invention, the method of manufacturing the external force detection sensor is characterized in that the set sensor element forming area of the element substrate is machined from both face and back surface sides to form a membrane, the etching stop layer comprised of the electrically conductive material is formed on the back surface side of the membrane, and then, the support substrate is joined with the back surface side of the element substrate, and the membrane is machined by the through-hole dry-etching from the face side to form the sensor element.

According to a ninth aspect of the invention, the method of manufacturing the external force detection sensor is characterized in that the invention to constitute the above-described second, third, fifth, sixth, seventh or eighth aspect is formed of a silicon, the support substrate is formed of a glass material, and the element substrate and the support substrate are anodically joined with each other.

According to a tenth aspect of the invention, the method of manufacturing the external force detection sensor is characterized in that the constitution of either one of the above-described first to ninth aspects is provided, and the etching stop layer is formed of the electrically conductive material in which the etch selectivity, i.e., the ratio of the dry-etch rate of the element substrate to the dry-etch rate of the etching stop layer is not less than 1.

According to an eleventh aspect of the invention, the method of manufacturing the external force detection sensor is characterized in that the sensor element to constitute either of the above-described first to tenth aspects is a movable element.

In the present invention, the etching stop layer is formed of the electrically conductive material, and thus, even when the positive ion in the etching gas entering inside the through holes during the over-etching operation collides with the etching stop layer to charge the etching stop layer positive while the through holes are formed in the element substrate by through-hole dry etching, the positive charge in the etching stop layer is instantaneously and electrically neutralized by the negative charge on the side wall surface of the through holes, and the positively charged condition of the etching stop layer is eliminated and not continuous.

Thus, almost all positive ions in the etching gas entering inside the through holes during the over-etching operation are advanced straight toward the etching stop layer, and prevented from colliding with the side wall surface of the through holes. The notch forming in the side wall surface of the through holes can be avoided thereby.

Further, since the etching stop layer is formed of electrically conductive material and its heat conductivity is excellent, the etching stop layer can function as a heat transfer passage, and the temperature of the area to be etched can be substantially uniform almost over the whole area, and the excessive etching attributable to non-uniform temperature can be prevented.

As described above, by forming the etching stop layer of electrically conductive material, both the notch forming in the side wall surface of the through holes and the excessive etching can be avoided. The sensor element can be manufactured as designed with excellent dimensional accuracy thereby. Thus, the external force detection sensor excellent in sensitivity, stable in output sensitivity and reliable in quality can be provided.

In a method of manufacturing the external force detection sensor where the recessed part is provided in the back side of the element substrate to form the membrane, and the above-described membrane is machined by through-hole dry etching to form the sensor element, where the dummy support substrate is joined with the element substrate, and the above-described element substrate is machined by the through-hole dry etching to form the sensor element, where the etching stop layer is formed in the preset sensor element forming area on the back side of the element substrate, the support substrate with the recessed part formed therein is joined with the above-described element substrate, and the above-described membrane is machined by the through-hole dry etching to form the sensor element, or where the recessed part is formed on both the face and back sides of the element substrate to form the membrane, and the above-described membrane is machined by the through-hole dry etching to form the sensor element, the sensor element is very fine in size, and it is not easy to form the sensor element with excellent dimensional accuracy. However, by using the present invention, it becomes easy to manufacture the sensor element as designed with excellent dimensional accuracy even if it is very fine, and the sensor element is very effective to manufacture the external force detection sensor compact in size and excellent in performance.

In a method of manufacturing the external force detection sensor where the etching stop layer is formed in the preset sensor element forming area on the back side of the element substrate, the support substrate with the recessed part formed therein is joined with the above-described element substrate, the element substrate is machined thin to the specified thickness, and the above-described membrane is machined by the through-hole dry etching to form the sensor element, the thin element substrate can be protected by the support substrate during the manufacture, the breakage of the element substrate can be prevented, and the yield of the external force detection sensor can be improved.

In a manufacturing method where the element substrate is formed of silicon, the support substrate is formed of a glass material, and the element substrate is anodically joined with the support substrate, the element substrate can be firmly joined with the support substrate to improve the mechanical reliability of the external force detection sensor.

When the sensor element is a movable element, stricter dimensional accuracy is required, and the stricter requirements can be sufficiently coped with by using the present invention, whereby a sensor element which is a movable element excellent in characteristic can be manufactured, and an external force detection sensor excellent in sensitivity and stable in output sensitivity can be provided.

In addition, when the etching stop layer is formed of the electrically conductive material which is not less than 1 in etch selectivity which is the ratio of the dry etch rate of the element substrate to the dry etch rate of the etching stop layer, a condition where holes are formed in the etching stop layer during the dry etching can be avoided.

For the purpose of illustrating the invention, there is shown in the drawings several forms which are presently preferred, it being understood, however, that the invention is not limited to the precise arrangements and instrumentalities shown.

Other features and advantages of the present invention will become apparent from the following description of the invention which refers to the accompanying drawings.

BRIEF DESCRIPTION OF THE DRAWING(S)

FIGS. 1A to 1E are views illustrating a first embodiment of a method of manufacturing an external force detection sensor of the present invention;

DETAILED DESCRIPTION OF EMBODIMENTS OF THE INVENTION

Figure 2A:
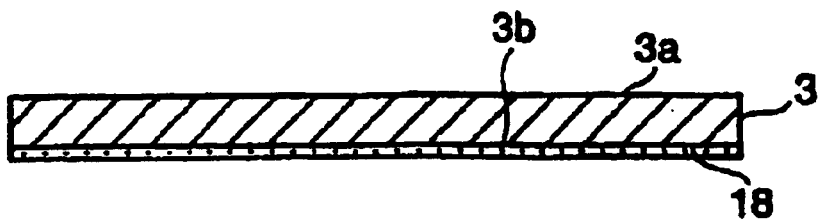
FIGS. 2A to 2E are views illustrating a second embodiment.

Hereinafter, the preferred embodiments of the present invention are explained in detail with reference to the drawings.

The embodiments of the present invention are described referring to the drawings.

FIG. 1A to FIG. 1E illustrate a first embodiment of a manufacturing method of an external force detection sensor of the present invention. In the explanation of the first embodiment, the same symbol is given to the same component in the above-described conventional example, and the duplicate explanation of common parts is omitted.

The first embodiment is characterized in that an etching stop layer 18 formed in manufacturing a sensor element 1 to constitute the external force detection sensor is formed of an electrically conductive material. Other constitutions are same as those in the above-described conventional example.

Recently, higher sensitivity has been demanded for the external force detection sensor such as an angular velocity sensor, and it is desired to manufacture the sensor element 1 with more excellent dimensional accuracy. Thus, a notch n and excessive etching formed on a side wall surface of a through hole 20 have raised a serious problem as described above. In a conventional practice as described above, the etching stop layer 18 has been formed of an insulating material from the viewpoint of facilitation in forming the layer and simplification of the manufacturing process, and no consideration has been given to forming the etching stop layer 18 of other materials. However, to solve the above-described problem, in accordance with the present invention, the etching stop layer 18 is formed of a electrically conductive material.

That means, in this first embodiment, as indicated in FIG. 1A, a recessed part 16 is formed on a back surface 3b of an element substrate 3 to form a membrane 17 of a specified thickness d (e.g., 70 µm). As indicated in FIG. 1B, the etching stop layer 18 is formed on a top surface 16a (a back surface side of the membrane 17) of the recessed part 16. In this first embodiment, as described above, the etching stop layer 18 is formed of an electrically conductive material, and the etching stop layer 18 is formed on the top surface 16a of the above-described recessed part 16 by, for example, electron beam evaporation method or film forming technology such as sputtering. In this first embodiment, the electrically conductive material to form the etching stop layer 18 is not less than 1 in etch selectivity (i.e., the ratio of the dry etch rate of the element substrate 3 to the dry etch rate of the etching stop layer 18) in order to surely perform the function as the etching stop layer.

Next, as indicated in FIG. 1C, the support substrate 2 is arranged on a back surface 3b side of the element substrate 3, and the support substrate 2 and the element substrate 3 are anodically joined with each other. As indicated in FIG. 1D, the through-hole dry etching of the membrane 17 of the element substrate 3 is effected from the face 3a side making use of photolithography and dry-etching technology such as RIE to form a plurality of through holes 20 reaching the above-described etching stop layer 18, and the sensor element 1 as illustrated in FIG. 6 is formed by a plurality of through holes 20.

In effecting the above-described through-hole dry etching, during over-etching operation, an etching gas enters inside the through holes 20, and the positive ion in the etching gas collides with the etching stop layer 18, and the etching stop layer 18 is charged positive. Since the etching stop layer 18 is formed of electrically conductive material, the positive charge in the etching stop layer 18 is instantaneously and electrically neutralized by the negative charge on the side wall surface of the through holes 20 to eliminate the positively charged condition of the etching stop layer 18.

In the through holes 20 during the over-etching operation, the positive ions in the etching gas enter are advanced straight toward the etching stop layer 18, and collide with the etching stop layer 18, preventing a problem in a conventional practice that the course of the positive ions is curved (attributable to the etching stop layer 18 which is continuously charged positive), and thereby collide with the side wall surface of the through holes 20 to form a notch n in the side wall surface.

Further, in this first embodiment, the etching stop layer 18 is formed of electrically conductive material which is excellent in thermal conductivity, as described above, and can function as a heat transfer passage. Thus, even when a part surrounded by the through holes 20 generates heat because of the collision of the etching gas, the heat is transferred to other areas through the etching stop layer 18, and the temperature of essentially the whole area to be etched can be set at essentially the same temperature. Excessive etching attributable to non-uniform temperature can be avoided thereby.

As described above, the notch n preventive effect of the side wall surface of the through holes 20 and the excessive etching avoiding effect attributable to the non-uniform temperature can be demonstrated by forming the etching stop layer 18 of the electrically conductive material. In particular, based on experiments by the inventor, the above-described effects are remarkable and preferable when the electrically conductive material of the etching stop layer is not less than $1 \times 10^6$ $\Omega^{-1} \cdot m^{-1}$ in electric conductivity and not less than $0.1 W \cdot cm^{-1} \cdot K^{-1}$ in heat conductivity. For example, the etching stop layer 18 may be optimally formed of titanium ($1.7 \times 10^6$ $\Omega^{-1} \cdot m^{-1}$ in electric conductivity and $0.219 W \cdot cm^{-1} \cdot K^{-1}$ in heat conductivity) or aluminum ($3.8 \times 10^7$ $\Omega^{-1} \cdot m^{-1}$ in electric conductivity and $2.37 W \cdot cm^{-1} \cdot K^{-1}$ in heat conductivity).

Nickel or copper, etc. may, of course, be used for the electrically conductive material of the etching stop layer 18. The thickness of the etching stop layer 18 is appropriately set considering the kind of electrically conductive material used to form the etching stop layer 18 and the thickness of the membrane 17, and, for example, when the etching stop layer 18 is formed of titanium or aluminum, the etching stop layer 18 is formed to approximately 300 nm in thickness.

After the specified forming of all through holes 20 is completed by the through-hole dry etching, the etching stop layer 18 formed of the above-described electrically conductive material is removed by a wet etching process as indicated in FIG. 1E with, for example, hydrofluoric acid aqueous solution. The above-described hydrofluoric acid aqueous solution removes the etching stop layer 18 of the electrically conductive material by a wet etching process, but the element substrate 3 is not damaged thereby.

As described above, after the etching stop layer 18 is removed by a wet etching process, a lid part 30 as indicated by a broken line in FIG. 1E as necessary. In such a case, for example, a glass substrate which is the lid part 30 with a recessed part 31 formed therein, is arranged on a face side of the element substrate 3 indicated in FIG. 1E, and the recessed part 31 of the above-described glass substrate 30 is arranged opposite to the sensor element 1 of the element substrate 3, and the element substrate 3 is lapped on the glass substrate 30 so as to be anodically joined with each other. When the lid part 30 is thus provided, the sensor element 1 is stored and sealed in an internal space to be formed by the support substrate 2 and the lid part 30, and the internal space can be evacuated according to the operational characteristic of the sensor element 1.

In this first embodiment, the external force detection sensor is manufactured by the above-described manufacturing method.

In this first embodiment, the etching stop layer 18 is formed of the electrically conductive material, and the etching stop layer 18 at a bottom part of the through holes 20 under the over-etching operation can be prevented from being continuously charged positive during the through-hole dry etching, and the notch n forming of the side wall surface of the through holes 20 attributable to the continuous positive-charge of the etching stop layer 18 can be avoided. Since the etching stop layer 18 formed of the electrically conductive material can function as a heat transfer passage, the heat is transferred through the etching stop layer 18, and the temperature can be maintained approximately the same over almost all of the area to be etched, and the excessive etching attributable to the non-uniform temperature can be prevented.

As described above, since both the notch n forming and the excessive etching can be prevented, the sensor element 1 can be manufactured with excellent dimensional accuracy, the external force detection sensor excellent in sensitivity and stable in output sensitivity can be provided, and the reliability of the quality of the external force detection sensor can be improved.

Further, in this first embodiment, the etching stop layer 18 is formed of the electrically conductive material in which the above-described etch selectivity is not less than 1, and there is hardly a problem that the etching stop layer 18 is subjected to the etching removal during the through-hole dry etching and that holes are formed in the etching stop layer 18. Even if holes are formed in the etching stop layer 18, the etching stop layer 18 is formed almost over the whole area of the top surface 16a of the recessed part 16 in this first embodiment, and the top surface 16a of the recessed part 16 can be prevented from being damaged by the etching gas entering inside the recessed part 16 from holes in the above-described etching stop layer 18.

As indicated in the above-described first embodiment, the etching stop layer 18 is formed of the electrically conductive material, and thus various changes must be given to the conventional manufacturing process, which one skilled in the art would appreciate and, accordingly, the detailed explanation of such changes is omitted here.

A second embodiment is described below. In the explanation of the second embodiment, the same symbol is given to the same component in the above-described first embodiment, and the duplicate explanation of common parts is omitted.

FIG. 2A to FIG. 2E illustrate the second embodiment of the manufacturing method of the external force detection sensor of the present invention. In this second embodiment, firstly as indicated in FIG. 2A, the etching stop layer 18 is formed almost over the whole area of the back surface 3b of the element substrate 3 by film forming technology such as sputtering. Also in this second embodiment, the etching stop layer 18 is formed of electrically conductive material similar to that in the above-described embodiment.

Figure 2B:
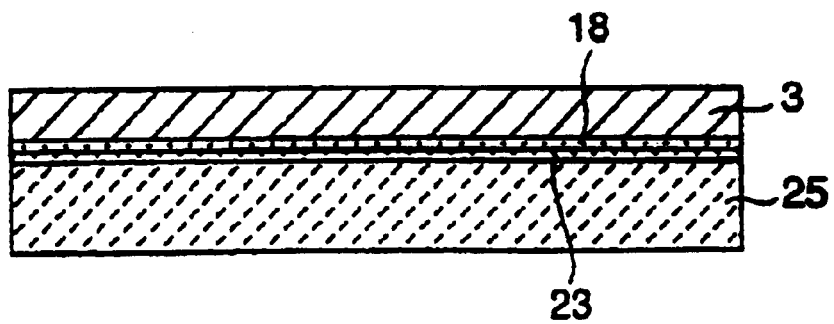

As indicated in FIG. 2B, a dummy support substrate 25 is attached to the back surface 3b side of the above-described element substrate 3 through the above-described etching stop layer 18 and an adhesive layer (e.g., photo resist) 23.

Figure 2C:
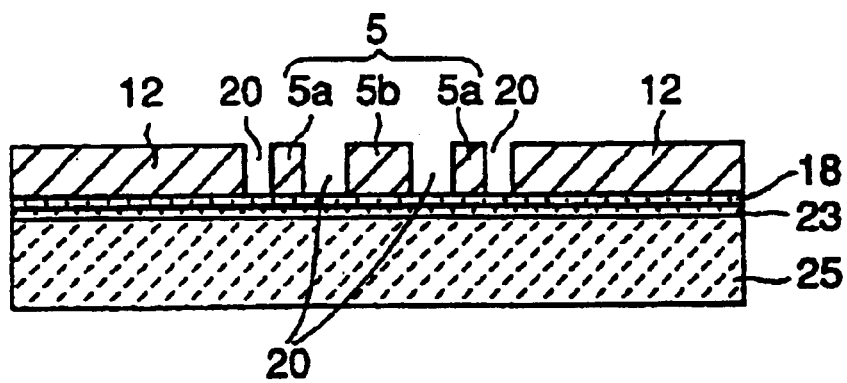

After that, as indicated in FIG. 2C, a plurality of through holes 20 leading to the etching stop layer 18 from the face 3a side of the element substrate 3 are formed by through-hole dry etching to form the sensor element 1 as illustrated in FIG. 6.

Figure 2D:
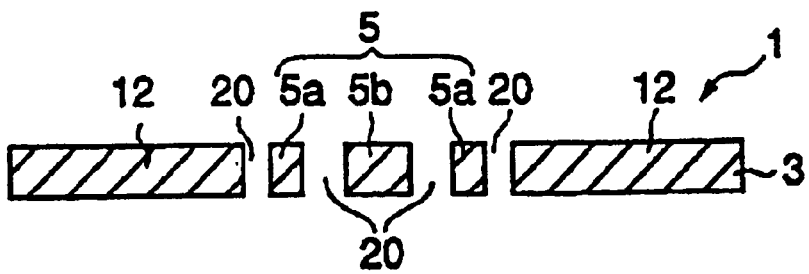

A coupled body of the above-described element substrate 3 with the dummy support substrate 25 is immersed in acetone solution, etc. to dissolve the adhesive layer 23, and the dummy support substrate 25 is separated from the element substrate 3. Then, as indicated in FIG. 2D, the etching stop layer 18 formed of the above-described electrically conductive material is removed by a wet etching process using an aqueous solution such as hydrofluoric acid aqueous solution.

Figure 2E:
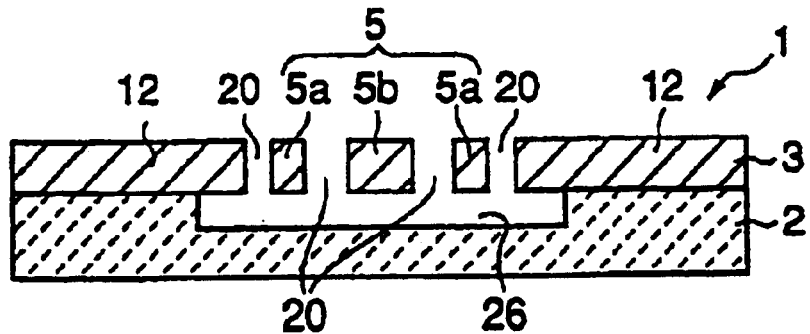

After that, as indicated in FIG. 2E, the glass support substrate 2 with the recessed part 26 formed therein is arranged on the back surface 3b side of the element substrate 3, the recessed part 26 of the above-described support substrate 2 is arranged opposite to the sensor element 1 of the element substrate 3, and the support substrate 2 is anodically joined with the element substrate 3. Further, the lid part 30 illustrated in the above-described first embodiment may be simultaneously anodically joined with the face side of the element substrate 30 as necessary. The recessed part 26 of the above-described support substrate 2 is provided not to prevent the above-described sensor element 1 from being moved.

Also in this second embodiment, the etching stop layer 18 is formed of electrically conductive material similar to that in the above-described first embodiment, and thus, the etching stop layer 18 is prevented from being continuously charged positive, and the notch n forming on the side wall surface of the through holes 20 can be avoided, non-uniform temperature in the area to be etched can be prevented, and the excessive etching attributable to the uniform temperature can be avoided. Thus, the sensor element 1 can be manufactured with excellent dimensional accuracy, and the external force co detection sensor excellent in sensitivity and stable in output sensitivity can be provided.

A third embodiment is described below. In the explanation of the third embodiment, the same symbol is given to the same component in the above-described respective embodiments, and the duplicate explanation of common parts is omitted.

Figure 3A:
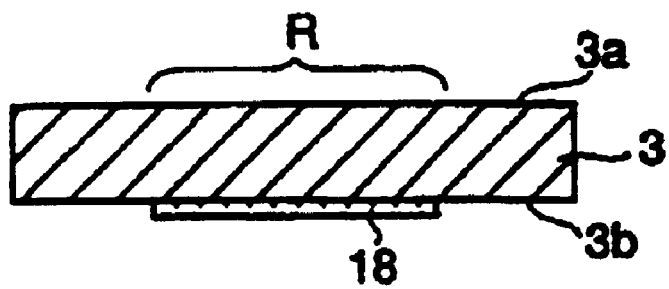
FIGS. 3A to 3D are views illustrating a third embodiment.

FIG. 3A to FIG. 3D illustrate the third embodiment of the manufacturing method of the external force detection sensor. In this third embodiment, firstly as indicated in FIG. 3A, the etching stop layer 18 is formed in a preset sensor element forming area R (i.e., an area to form the sensor element 1 indicated in FIG. 6A) on the back surface 3b of the semi-conductor element substrate 3. Also in this third embodiment, the etching stop layer 18 is formed of electrically conductive material similar to that in the above-described first and second embodiments, and the etching stop layer 18 is formed on the back surface 3b side of the element substrate 3 by electron beam evaporation method and film forming technology such as sputtering similar to the above-described first and second embodiments.

Figure 3B:
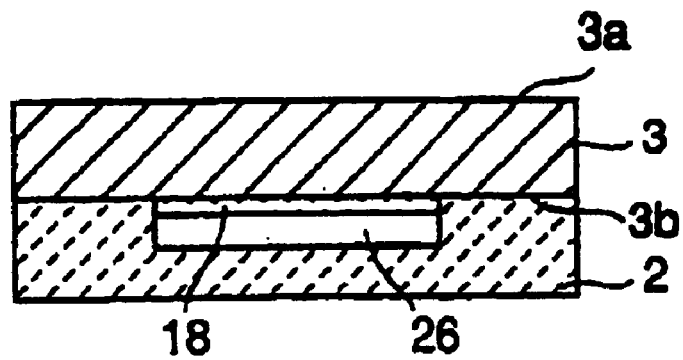

As indicated in FIG. 3B, the glass support substrate 2 with the recessed part 26 formed therein is arranged on the back surface 3b side of the element substrate 3, the recessed part 26 of the support substrate 2 is arranged opposite to the etching stop layer 18 of the element substrate 3, and the support substrate 2 is anodically joined with the element substrate 3.

Figure 3C:
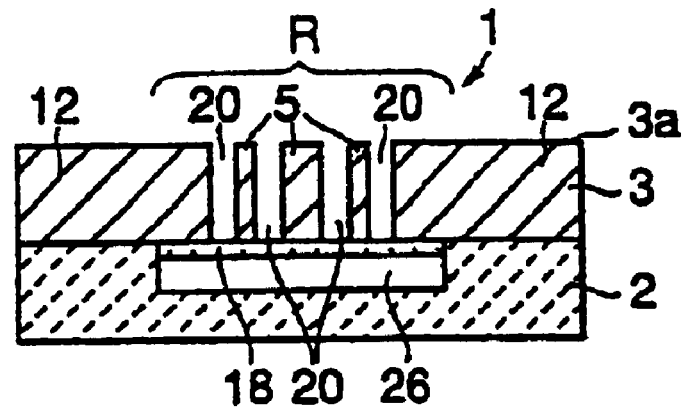
Figure 3D:
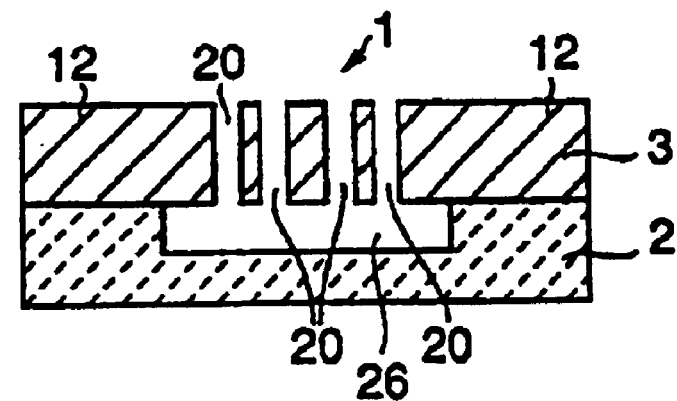
Figure 6A:
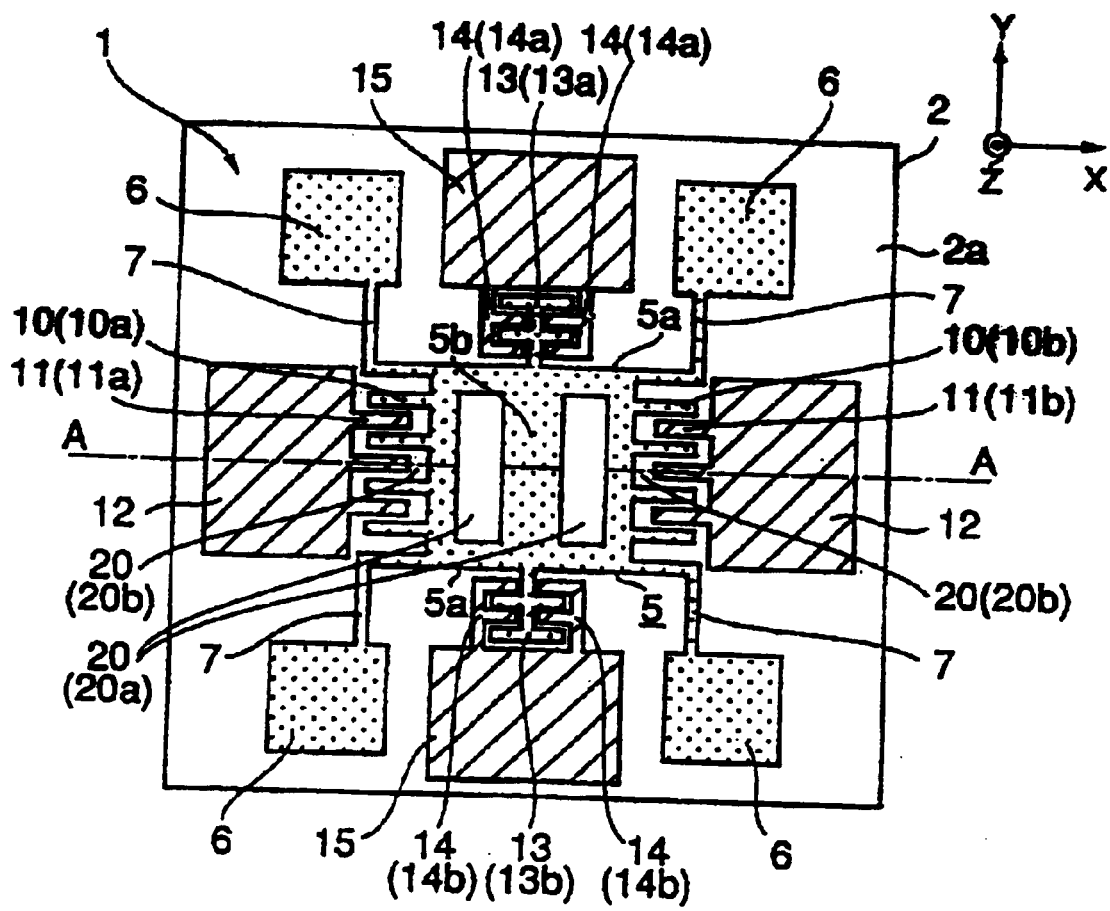
FIGS. 6A and 6B are views illustrating an example of the external force detection sensor.

After that, as indicated in FIG. 3C, the sensor element forming area R is worked from the face 3a side of the element substrate 3 by through-hole dry etching to form a plurality of through holes 20 leading to the etching stop layer 18, and the sensor element 1 as indicated in FIG. 6A is formed. Then, as indicated in FIG. 3D, the etching stop layer 18 is removed by the method similar to that in the above-described first and second embodiments. Then, the lid part 30 described in the first embodiment may be anodically joined with the face side of the element substrate 30, as necessary. The external force detection sensor is thus manufactured.

Also in this third embodiment, the etching stop layer 18 is formed of electrically conductive material similar to the above-described first and second embodiments, and thus, both the notch n forming in the side wall surface of the through holes 20 and the excessive etching can be avoided to form the sensor element 1 to the designed dimensions. Thus, the external force detection sensor excellent in sensitivity and stable in output sensitivity can be provided.

A fourth embodiment is described below. In the explanation of the fourth embodiment, the same symbol is given to the same component in the above-described respective embodiments, and the duplicate explanation of common parts is omitted.

Figure 4A:
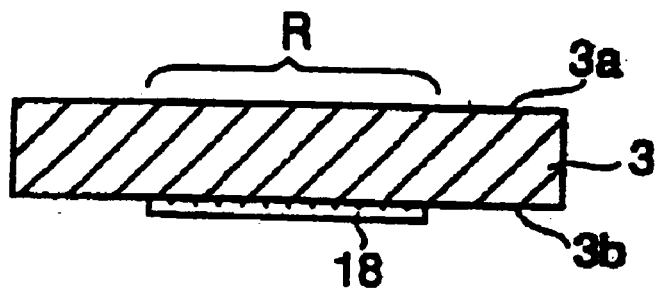
FIGS. 4A to 4E are views illustrating a fourth embodiment.
Figure 4B:
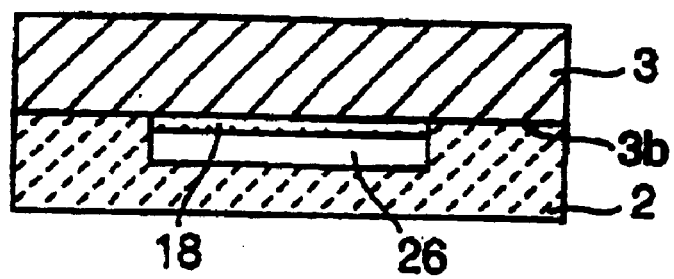
Figure 4C:
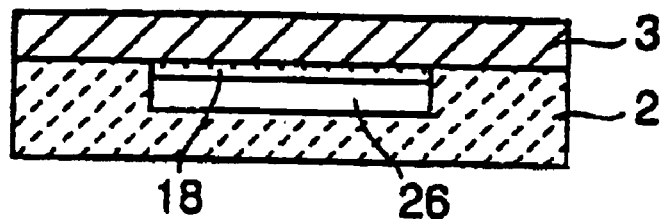
Figure 4D:
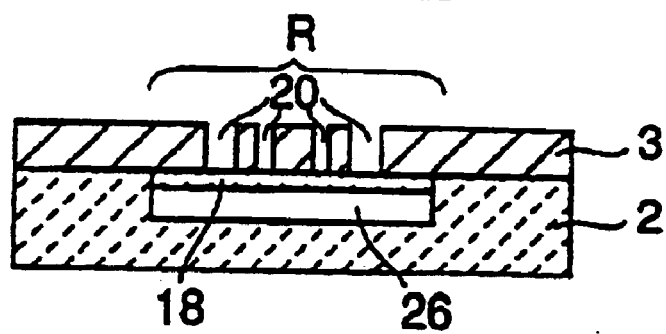
Figure 4E:
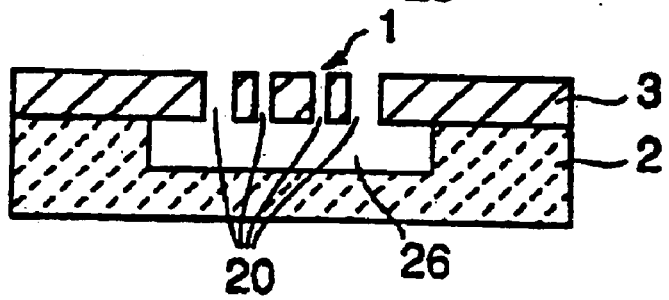

FIG. 4A to FIG. 4E illustrate the fourth embodiment of the manufacturing method of the external force detection sensor. In this fourth embodiment, the external force detection sensor is manufactured by the manufacturing process approximately similar to the above-described third embodiment, but the fourth embodiment is differently characterized in that after the glass support substrate 2 is anodically joined with the semi-conductor element substrate 3 as indicated in FIG. 4B, the element substrate 3 is reduced in thickness by the etching or cutting to a predetermined value as indicated in FIG. 4C, and a plurality of through holes 20 are formed in the element substrate 3 by through-hole dry etching to form the sensor element 1.

In this fourth embodiment, the etching stop layer 18 is formed of electrically conductive material similar to the above-described first and third embodiments, and thus, both the notch n forming in the side wall surface of the through holes 20 and the excessive etching can be avoided, the sensor element 1 can be formed with excellent dimensional accuracy, and the external force detection sensor excellent in sensitivity and stable in output sensitivity can be provided.

When the thin-machined element substrate 3 is handled in a single body condition in manufacturing the external force detection sensor, the thin single element substrate 3 is easy to break, including cracking and partly chipping. To cope with this, in this fourth embodiment, the support substrate 2 is joined with the element substrate 3 before the element substrate 3 is formed thin, and then, the element substrate 3 is formed thin. Thus, the thin element substrate 3 is not handled in a single body condition, and the breakage of the element substrate 3 during the manufacture can be prevented. Further, a very precise handling device can be dispensed with to manufacture the external force detection sensor.

A fifth embodiment is described below. In the explanation of the fifth embodiment, the same symbol is given to the same component in the above-described respective embodiments, and the duplicate explanation of common parts is omitted.

Figure 5A:
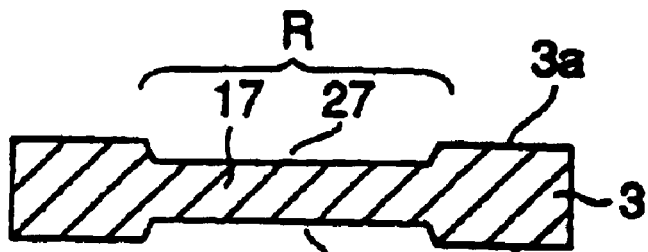
FIGS. 5A to 5E are views illustrating a fifth embodiment.

FIG. 5A to FIG. 5E illustrate the fifth embodiment of the manufacturing method of the external force detection sensor. In this fifth embodiment, firstly as indicated in FIG. 5A, recessed parts 27, 28 are formed in a preset sensor element forming area R on both the face side 3a and the back surface 3b of the semi-conductor element substrate 3 to form the membrane 17.

Figure 5B:
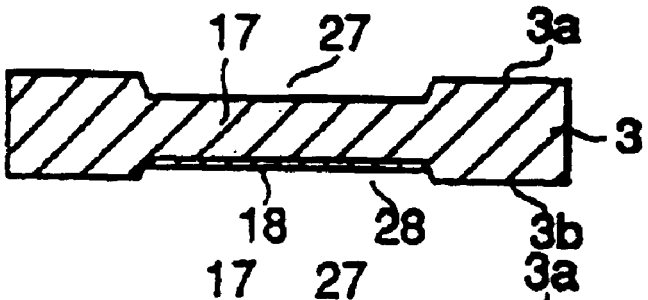

Next, as indicated in FIG. 5B, the etching stop layer 18 is formed on the back side of the above-described membrane 17. Also in this fifth embodiment, the etching stop layer 18 is formed of electrically conductive material similar to the above-described first and fourth embodiments.

Figure 5C:
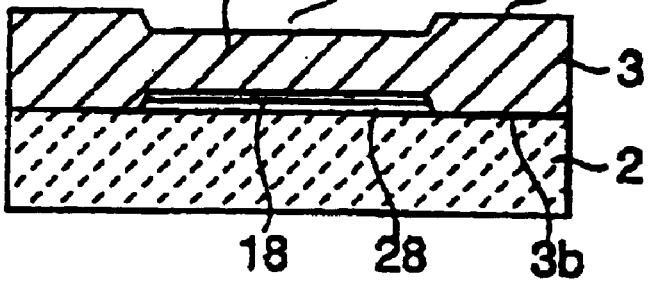
Figure 5D:
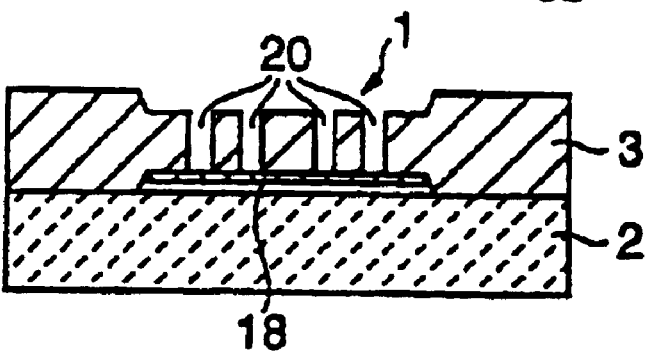
Figure 5E:
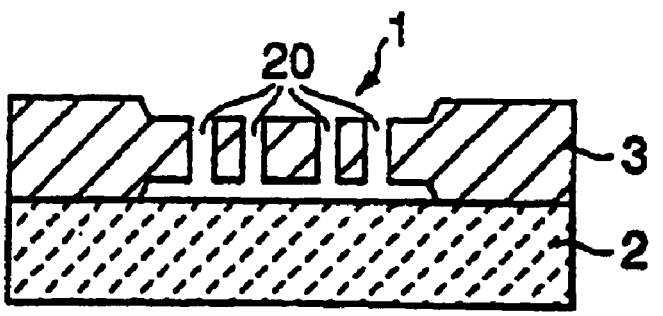

After that, the glass support substrate 2 is anodically joined with the back surface 3b side of the element substrate 3 as indicated in FIG. 5C, and as indicated in FIG. 5D, a plurality of through holes 20 are formed by through-hole dry etching of the membrane 17 from its face side to form the sensor element 1 as indicated in FIG. 6. Then, as indicated in FIG. 5E, the etching stop layer 18 is removed by a method similar to that in the above-described first and fourth embodiments to form the sensor element 1. Then, the lid part 30 may be provided on the face side of the element substrate 3 similar to the above-described first and fourth embodiments. The external force detection sensor can be manufactured as described above.

Also in this fifth embodiment, the etching stop layer 18 is formed of electrically conductive material similar to the above-described first and fourth embodiments, and thus, both the notch n forming in the side wall surface of the through holes 20 and the excessive etching can be avoided, the sensor element 1 can be formed to the designed dimensions, and the sensitivity and the stability in the output sensitivity of the external force detection sensor can be improved.

The present invention is not limited to the above-described respective embodiments, but can be of various embodiments. For example, in the above-described embodiments, the element substrate 3 is not cooled during the dry etching, but the element substrate 3 may be cooled during the dry etching. When the etching stop layer 18 is formed of the insulating material like a conventional practice, the above-described problem of non-uniform temperature arises even if the whole element substrate 3 is cooled during the through-hole dry etching. On the other hand, by forming the etching stop layer 18 of electrically conductive material, similar effect to that in the above-described embodiments can be obtained even when the element substrate 3 is cooled during the through-hole dry etching.

Further, in the above-described second embodiment, the element substrate 3 is joined with the dummy support substrate 25 through the etching stop layer 18 and the adhesive layer 23, but when the etching stop layer 18 is formed of an electrically conductive adhesive, such as an electrically conductive resin, the etching stop layer 18 can function as the adhesive layer, and the above-described adhesive layer 23 may be dispensed with.

In addition, in the above-described embodiments, the support substrate 2 is formed of a glass material, but the material of the support substrate 2 is not so limited and may be formed of silicon or other materials.

Further, in the above-described embodiments, the etching stop layer 18 is formed of electrically conductive material whose etch selectivity is not less than 1, but when the thickness of the etching stop layer 18 is increased, it may be formed of electrically conductive material whose etch selectivity is less than 1.

Figure 6B:
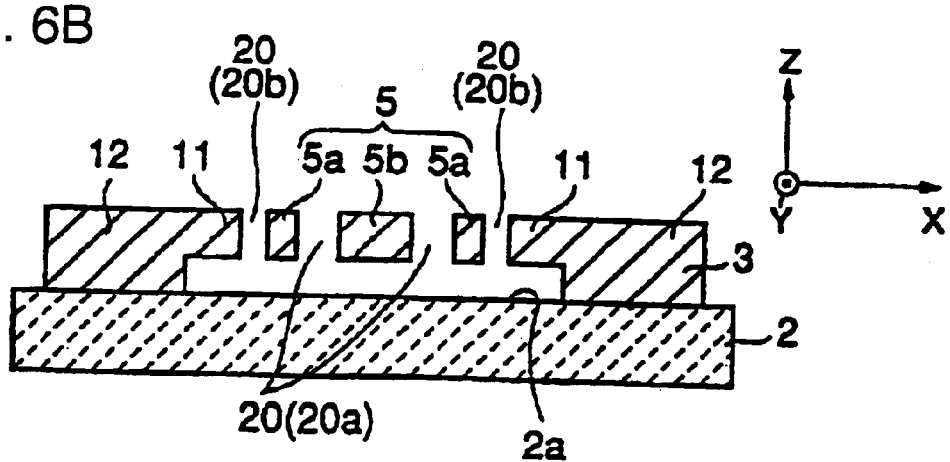
Figure 7A:
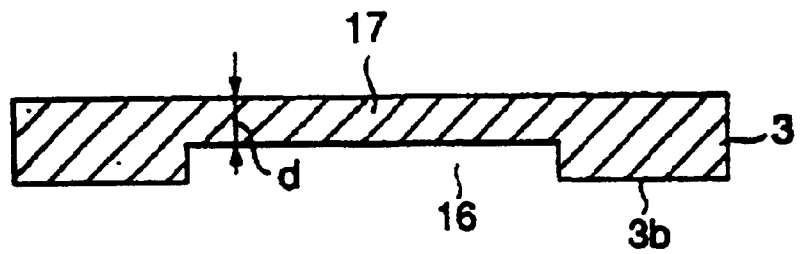
FIGS. 7A to 7E are views illustrating an example of a conventional method of manufacturing the external force detection sensor.
Figure 7B:
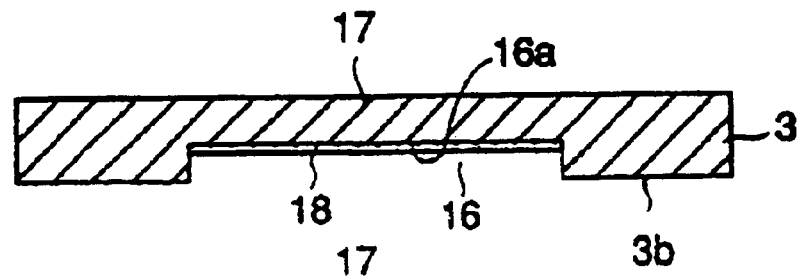
Figure 7C:
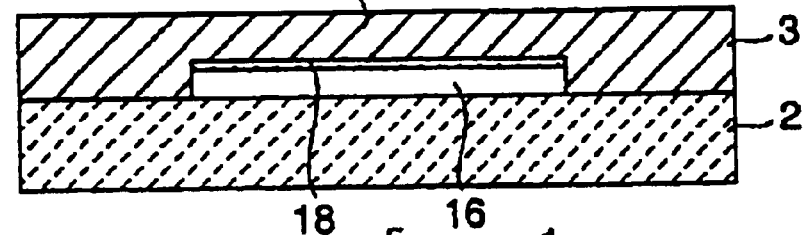
Figure 7D:
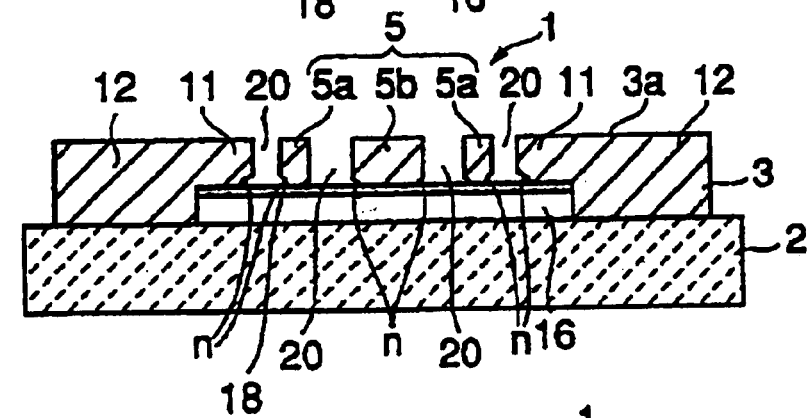
Figure 7E:
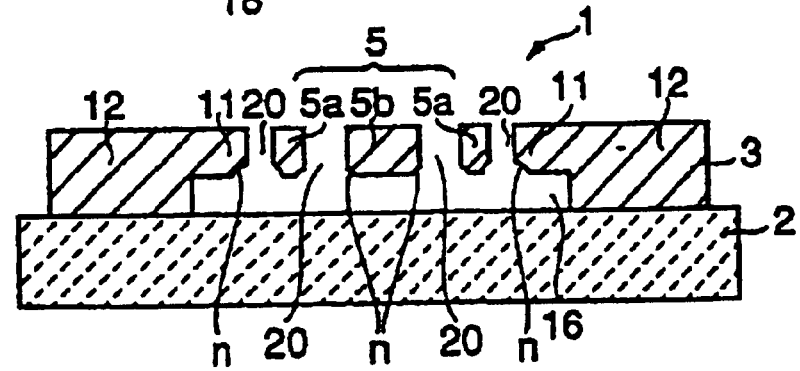
Figure 8A:
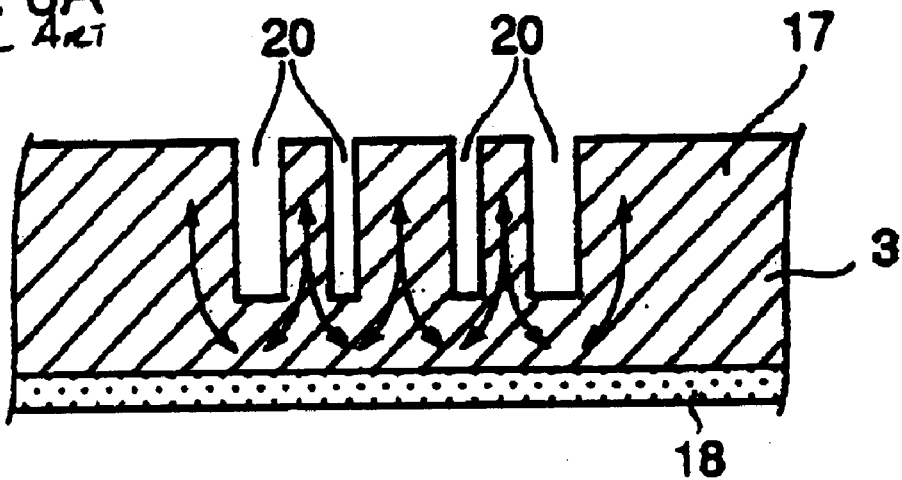
FIGS. 8A to 8C are views illustrating conventional problems.
Figure 8B:
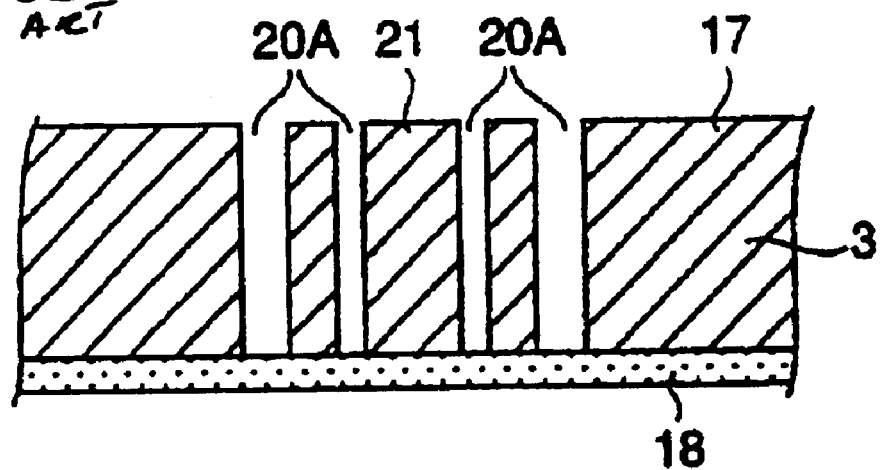
Figure 8C:
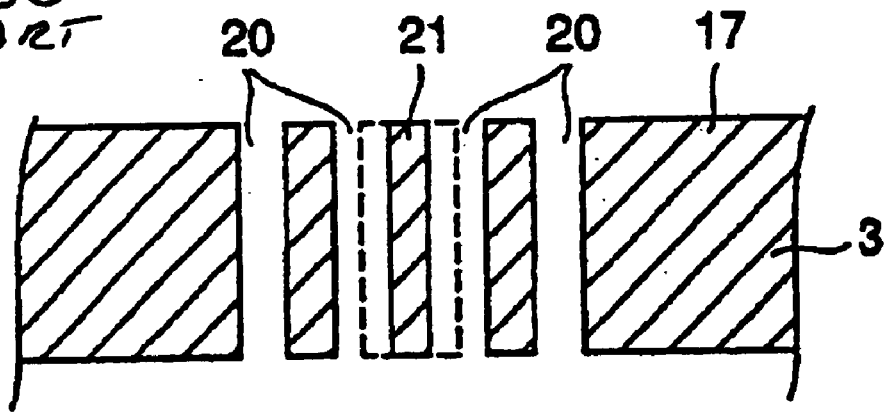

In addition, explanation of the invention has been given with respect to the angular velocity sensor illustrated in FIGS. 6A and 6B as an example, but, of course, the present invention is applicable to various external force detection sensors other than the angular velocity sensor illustrated in FIGS. 6A and 6B, such as an acceleration sensor.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of manufacturing an external force detection sensor comprising the steps of:
    providing a semiconductor element substrate;
    forming a recess in a surface of the semiconductor element substrate;
    forming an etching stop layer of an electrically conductive material on the surface of the semiconductor element substrate having the recess formed therein;
    through-hole dry etching the surface of the semiconductor element substrate using the etching stop layer;
    forming a sensor element including a vibrating body, fixed electrodes and movable electrodes on the semiconductor element substrate;
    removing the etching stop layer; and
    completing the manufacturing of the external force detection sensor.

2. A method of manufacturing an external force detection sensor according to claim 1, wherein the etching stop layer is formed of an electrically conductive material whose each selectivity which is the ratio of the dry-etch rate of the semiconductor element substrate to the dry-etch rate of an etching stop layer is not less than 1.

3. A method of manufacturing an external force detection sensor according to claim 2, wherein the etching stop layer is made of titanium or aluminum.

4. A method of manufacturing an external force detection sensor according to claim 1, further comprising the step of providing a dummy support substrate to support the semiconductor element substrate during the step of through-hole dry etching of the semicnductor element substrate to form the sensor element, wherein the etching stop layer is formed between the semiconductor element sustrate and the dummy support substrate.

5. A method of manufacturing an external force detection sensor according to claim 4, wherein the dummy support substrate and the etching stop layer are removed after the sensor element is formed and, after that, a support substrate with a recessed part formed therein is arranged on a back surface side of said semiconductor element substrate such that a recessed part of said support substrate arranged opposite to the sensor element and, then the support substrate is joined with the semiconductor element substrate.

6. A method of manufacturing an external force detection sensor according in claim 1, wherein the etching stop layer is formed in a preset sensor element forming area on a back surface side on the semiconductor element substrate.

7. A method of manufacturing an external force detection sensor according to claim 1, further comprising the step of forming a membrane by matching a preset sensor element forming area of the semiconductor element substrate from both front and back surface sides, and then forming the etching stop layer on a back surface side of the membrane.

8. A method of manufacturing an external force detection sensor comprising the steps of:
    forming a recessed part on a back surface side of a semiconductor element substrate;
    forming a membrane on a front surface side;
    providing an etching stop layer comprising an electrically conductive material on a top surface of the recessed part of said semiconductor element substrate;
    joining the back surface side of said semiconductor element substrate with a support substrate;
    forming a sensor element including a vibrating body, fixed electrodes and movable electrode by dry etching of the membrane of said semiconductor element substrate;
    removing the etching stop layer; and
    completing the manufacturing of the external force detection sensor.

9. A manufacturing method of an external force detection sensor according to claim 8, wherein the recessed part is formed in a center portion of the back surface side of the semiconductor element substrate.

10. A method of manufacturing an external force detection sensor according to claims 8 or 9, wherein the semiconductor element substrate is formed of a silicon material, the support substrate is formed of a glass material, and the semiconductor element substrate is anodically joined with the support substrate.

11. A method of manufacturing an external force detection sensor comprising the steps of:

providing a semiconductor element substrate;

providing a support substrate;

forming a recess in a surface of the semiconductor element substrate;

providing an etching stop layer comprising an electrically conductive material on a back surface of said semiconductor element substrate;

joining a back surface side of said semiconductor element substrate with a surface of the support substrate having said recess formed therein; and forming a sensor element including a vibrating body, fixed electrodes and movable electrodes by dry etching of said semiconductor element substrate;

removing the etching stop layer; and completing the manufacturing of the external force detection sensor.

12. A method of manufacturing an external force detection sensor according to claim 11, wherein the etching stop layer is formed of an electrically conductive material whose etch selectivity which is the ratio of the dry-etch rate of the semiconductor element substrate to the dry-etch rate of an etching stop layer is not less than 1.

13. A method of manufacturing an external force detection sensor according to claim 11, wherein the etching stop layer is made of titanium or aluminum.

* * * * *